(12) United States Patent
Jung et al.

(10) Patent No.: US 8,605,176 B2
(45) Date of Patent: Dec. 10, 2013

(54) ANALOG-TO-DIGITAL CONVERTER FOR CONTROLLING GAIN BY CHANGING A SYSTEM PARAMETER, IMAGE SENSOR INCLUDING THE ANALOG-TO-DIGITAL CONVERTER AND METHOD OF OPERATING THE ANALOG-TO-DIGITAL CONVERTER

(75) Inventors: Wun-Ki Jung, Suwon-si (KR); Seog Heon Ham, Suwon-si (KR); Dong Hun Lee, Yongin-si (KR); Kwi Sung Yoo, Seoul (KR); Min Ho Kwon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 510 days.

(21) Appl. No.: 12/879,684

(22) Filed: Sep. 10, 2010

(65) Prior Publication Data

US 2011/0069211 A1    Mar. 24, 2011

(30) Foreign Application Priority Data

Sep. 23, 2009 (KR) .................. 10-2009-0090197

(51) Int. Cl.
*H04N 3/14* (2006.01)
(52) U.S. Cl.
USPC ........................................ 348/294
(58) Field of Classification Search
USPC ........................................ 348/294
See application file for complete search history.

(56) References Cited

U.S. PATENT DOCUMENTS

| | | | |
|---|---|---|---|
| 2006/0232676 A1* | 10/2006 | Boemler | 348/172 |
| 2007/0176108 A1* | 8/2007 | Such et al. | 250/370.09 |
| 2008/0169952 A1* | 7/2008 | Boemler | 341/143 |
| 2009/0289824 A1* | 11/2009 | Chen | 341/143 |
| 2012/0268632 A1* | 10/2012 | Kamon et al. | 348/294 |

FOREIGN PATENT DOCUMENTS

| | | |
|---|---|---|
| JP | 2005-175549 A | 6/2005 |
| KR | 95-18871 A | 7/1995 |
| KR | 10-2004-0072237 A | 8/2004 |
| WO | WO-2006113270 A1 | 10/2006 |

* cited by examiner

*Primary Examiner* — James Hannett
(74) *Attorney, Agent, or Firm* — Harness, Dickey & Pierce, P.L.C.

(57) ABSTRACT

Example embodiments are directed to an analog-to-digital converter (ADC) that controls a gain by changing a system parameter, an image sensor including the ADC and a method of operating the ADC. The ADC includes a sigma-delta modulator which receives an input signal and a clock signal and sigma-delta modulates the input signal into a digital output signal based on the clock signal and an accumulation unit which accumulates the digital output signal at each cycle of the clock signal according to an analog-to-digital conversion time and outputs an accumulation result. A system parameter is varied during the analog-to-digital conversion time to control a gain of the ADC. The method of operating the analog-to-digital converter includes sigma-delta modulating an input signal into a digital output signal in response to a clock signal input to the ADC; and accumulating the digital output signal at each cycle of the input clock signal according to an analog-to-digital conversion time and outputting an accumulation result.

18 Claims, 12 Drawing Sheets

ANALOG-TO-DIGITAL CONVERTER FOR CONTROLLING GAIN BY CHANGING A SYSTEM PARAMETER, IMAGE SENSOR INCLUDING THE ANALOG-TO-DIGITAL CONVERTER AND METHOD OF OPERATING THE ANALOG-TO-DIGITAL CONVERTER

CROSS-REFERENCE TO RELATED APPLICATIONS

This application claims the benefit under 35 U.S.C. §119 to Korean Patent Application No. 10-2009-0090197, filed on Sep. 23, 2009, in the Korean Intellectual Property Office, the disclosure of which is incorporated herein in its entirety by reference.

BACKGROUND

Example embodiments relate to an analog-to-digital converter (ADC), and more particularly, to an ADC for controlling a gain, an image sensor including the ADC to control sensitivity, and a method of operation of the analog-to-digital converter.

Photosensitivity control is relatively important function in digital image pick-up devices. Photosensitivity cannot be changed when images are photographed using a film, unless the film is changed, but the photosensitivity can be controlled with relative ease by operating a machine in digital image pick-up devices.

Generally, sensitivity control is relatively important function of image sensors. The sensitivity control is usually carried out by controlling the gain of an ADC included in an image sensor. A variable gain amplifier (VGA) is additionally provided before an input unit of the ADC to control the gain, so that the sensitivity of the image sensor is controlled. The ADC including the VGA is not efficient because it requires additional power and area, and may not provide high gain. Therefore, an ADC for controlling the sensitivity of an image sensor by varying a gain of the ADC without an additional element is desired.

SUMMARY

According to example embodiments, an analog-to-digital converter includes a sigma-delta modulator configured to sigma-delta modulate an input signal into a digital output signal in response to a clock signal; and an accumulation unit configured to accumulate the digital output signal at each cycle of the clock signal according to an analog-to-digital conversion time and output an accumulation result, wherein a system parameter during the analog-to-digital conversion time varies.

According to example embodiments, the system parameter that is varied is a number of clocks of the clock signal.

According to example embodiments, the accumulation unit receives the digital output signal, accumulates the digital output signal N times, and outputs a result of the N accumulations as the accumulation result, wherein N is a natural number equal to or greater than 2.

According to example embodiments, the accumulation unit comprises first through N-th accumulators connected in series, the first accumulator accumulating the digital output signal at each cycle of the clock signal, and the second through N-th accumulators accumulating an output of a previous accumulator at each cycle of the clock signal.

According to example embodiments, the analog-to-digital conversion time is fixed and a clock frequency of the clock signal is varied to vary the number of clocks of the clock signals during the analog-to-digital conversion time.

According to example embodiments, a clock frequency of the clock signal is fixed and the analog-to-digital conversion time is varied to vary the number of clocks of the clock signals during the analog-to-digital conversion time.

According to example embodiments, a clock frequency of the clock signal and the analog-to-digital conversion time are varied to vary the number of clocks of the clock signals during the analog-to-digital conversion time.

According to example embodiments, when the system parameter is varied, the accumulation result increases and a gain of the analog-to-digital converter increases.

According to example embodiments, an image sensor includes the analog-to-digital converter of example embodiments.

According to example embodiments, an electronic system includes the image sensor of example embodiments.

According to example embodiments, an image sensor includes a pixel array including a plurality of pixels; the analog-to-digital converter of example embodiments configured to receive a signal output from the pixel array and the clock signal, and to convert the input signal into a digital signal in an analog-to-digital conversion time; and a control circuit configured to vary the system parameter during the analog-to-digital conversion time and provide the varied system parameter to the analog-to-digital converter.

According to example embodiments, the system parameter that is varied is a number of clocks of the clock signal.

According to example embodiments, when the system parameter is varied, the accumulation result increases, a gain of the analog-to-digital converter increases and a sensitivity of the image sensor increases.

According to example embodiments, a method of operating an analog-to-digital converter includes sigma-delta modulating an input signal into a digital output signal in response to a clock signal input to the analog-to-digital converter; and accumulating the digital output signal at each cycle of the input clock signal according to an analog-to-digital conversion time and outputting an accumulation result.

According to example embodiments, the method further includes varying a system parameter during the analog-to-digital conversion time; and changing a gain of the analog-to-digital converter based on the accumulation result.

According to example embodiments, varying the system parameter during the analog-to-digital conversion time includes varying a number of clocks of the clock signal.

According to example embodiments, the method further includes fixing the analog-to-digital conversion time and varying a clock frequency of the input clock signal to vary the number of clocks of the clock signals during the analog-to-digital conversion time.

According to example embodiments, the method further includes fixing a clock frequency of the input clock signal and varying the analog-to-digital conversion time to vary the number of clocks of the clock signals during the analog-to-digital conversion time.

According to example embodiments, the method further includes varying a clock frequency of the input clock signal and the analog-to-digital conversion time to vary the number of clocks of the clock signals during the analog-to-digital conversion time.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
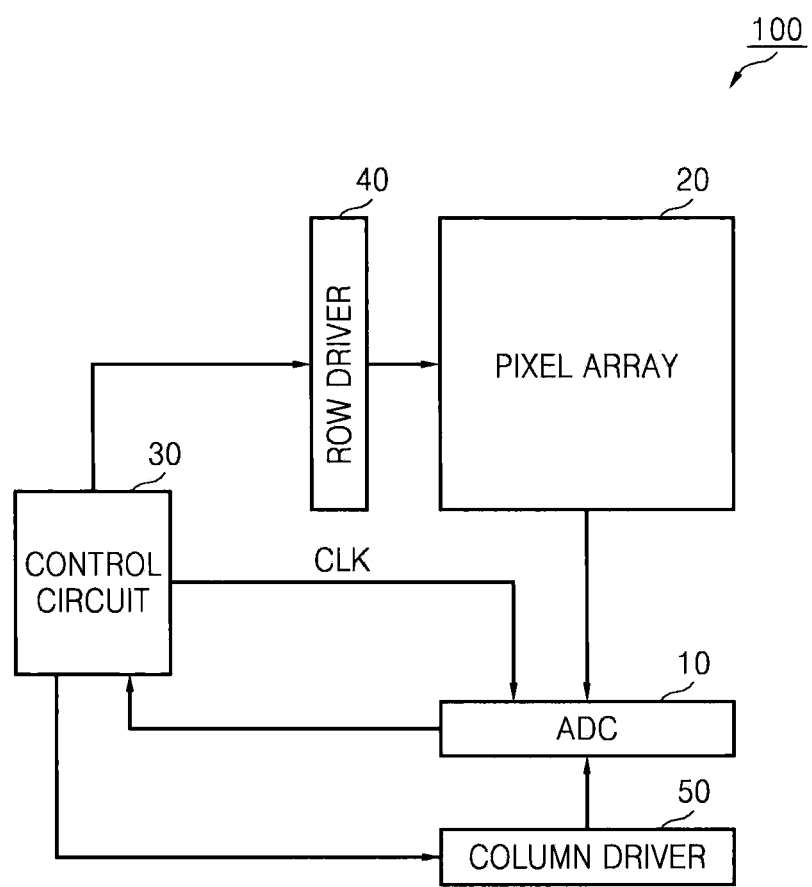
FIG. 1 is a block diagram of an image sensor according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of an image sensor 100 according to example embodiments. The image sensor 100 includes an analog-to-digital converter (ADC) 10, a pixel array 20, a control circuit 30, a row driver 40, and a column driver 50.

The pixel array 20 includes a plurality of pixels (not shown) arranged in a matrix form. The pixels sense information from an externally input image. The control circuit 30 generates a clock signal CLK and a plurality of control signals. The clock signal CLK is input to the ADC 10. Some of the control signals are input to the row driver 40 and some of them are input to the column driver 50.

The control circuit 30 controls the number of clock cycles of the clock signal CLK, thereby controlling the number of clock cycles of the clock signal CLK input to the ADC 10. In detail, the control circuit 30 may change the number of clock cycles of the clock signal CLK during analog-to-digital conversion time by changing the clock frequency of the clock signal CLK or may change the number of clock cycles of the clock signal CLK by changing the analog-to-digital conversion time at a fixed clock frequency of the clock signal CLK or may change the number of clock cycles of the clock signal CLK by changing both the clock frequency of the clock signal CLK and the analog-to-digital conversion time. The analog-to-digital conversion time is a time taken to convert an analog signal into a digital signal. It may be periodical or non-periodical and may be represented by absolute time (in seconds, for example) or the number of clock cycles, but it is not restricted thereto.

The row driver 40 selects a row in the pixel array 20 in response to the control signal(s). The ADC 10 receives the clock signal CLK from the control circuit 30. The ADC 10 also receives pixel signals (hereinafter, referred to as input signals) from pixels in the row selected by the row driver 40 and converts the input signals into digital signals. The ADC 10 may be a sigma-delta ADC. Hereinafter, for clarity of the description, a method of changing the gain of a sigma-delta ADC will be described, but example embodiments are not restricted thereto. The column driver 50 selects a digital signal corresponding to a particular column among the digital signals in response to a control signal(s).

Figure 2:
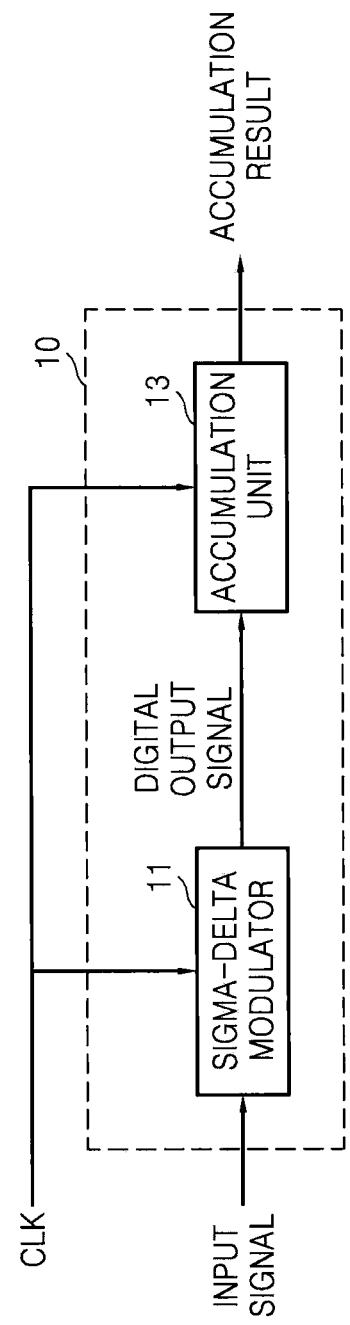
FIG. 2 is a block diagram of a sigma-delta analog-to-digital converter (ADC) according to example embodiments.

FIG. 2 is a block diagram of the sigma-delta ADC 10 according to example embodiments. Referring to FIG. 2, the sigma-delta ADC 10 includes a sigma-delta modulator 11 and an accumulation unit 13.

The sigma-delta modulator 11 operates in response to the clock signal CLK. The sigma-delta modulator 11 sigma-delta modulates an input signal into a digital output signal(s) and outputs the sigma-delta modulated digital output signal(s). Although not shown, the sigma-delta modulator 11 may include a loop filter, a quantizer for digital conversion, a digital-to-analog converter (DAC), and/or an adder/subtractor which sums an input signal and a feedback signal.

Figure 3:
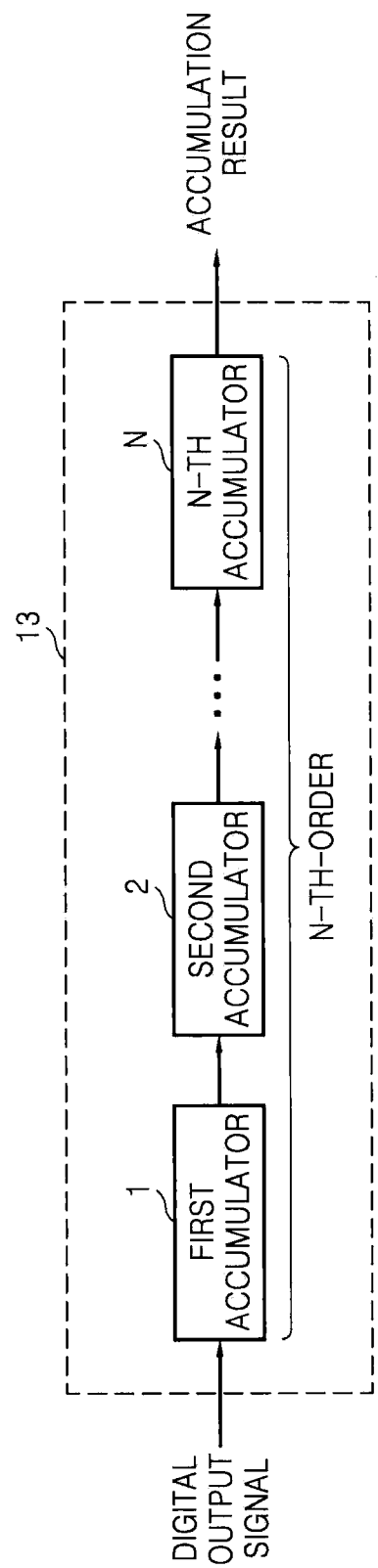
FIG. 3 is a block diagram of an accumulation unit illustrated in FIG. 2 according to example embodiments.

The accumulation unit 13 receives and accumulates the digital output signal(s) and outputs an accumulation result. The accumulation unit 13 may perform digital integration on the digital output signal(s) to accumulate them. The accumulation result may be a digital output value. The accumulation unit 13 includes N first-order accumulators 1, 2, . . . , N (FIG. 3). When the accumulation unit 13 includes the N first-order accumulators 1 through N, the sigma-delta modulator 11 may also include N modulators or an N-th-order modulator.

FIG. 3 is a block diagram of the accumulation unit 13 illustrated in FIG. 2 according to example embodiments. The accumulation unit 13 includes the N first-order accumulators 1 through N connected in series with each other. The N first-order accumulators 1 through N perform the same accumulation operation. The first accumulator 1 receives and accumulates the digital output signal(s). The second accumulator 2 receives and accumulates an output of the first accumulator 1. In the same manner, the N-th accumulator N accumulates an output of the (N−1)-th accumulator and outputs an accumulation result. The sigma-delta ADC 10 (FIG. 2) including the N accumulators 1 through N is referred to as an N-th-order sigma-delta ADC 10.

Figure 4:
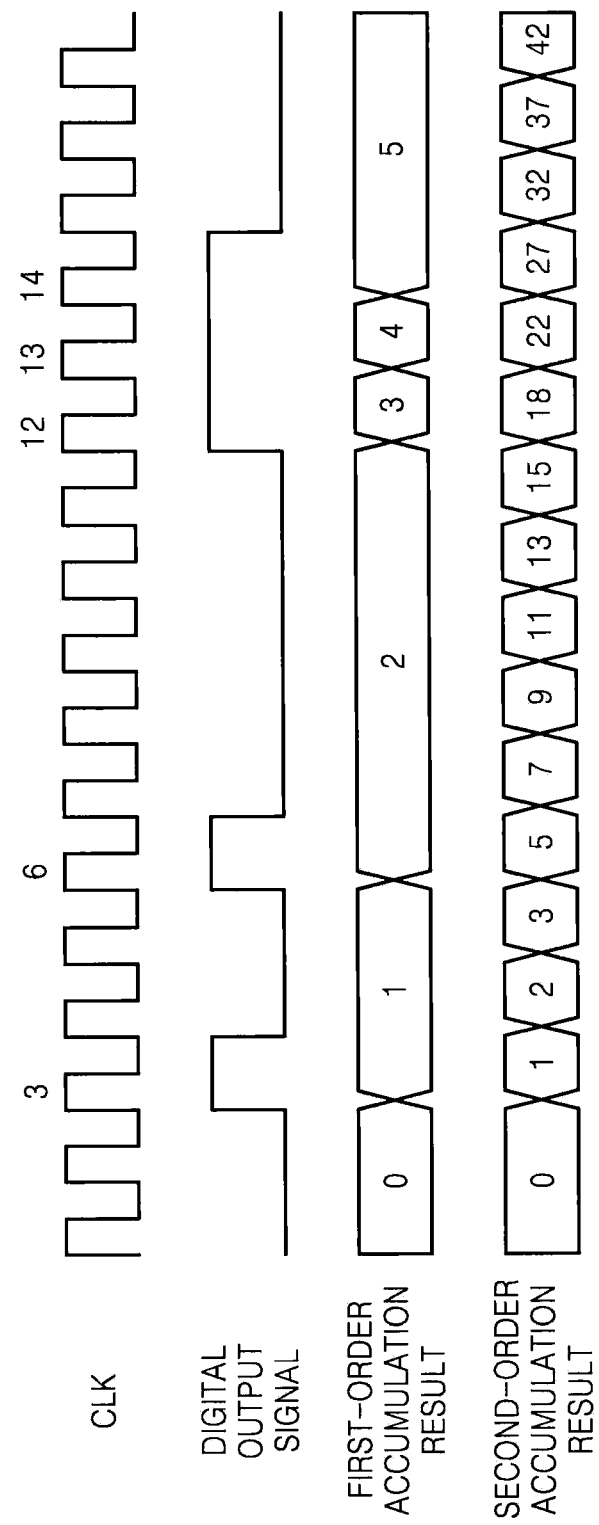
FIG. 4 is a diagram of the waveforms of signals generated by second order sigma-delta ADC of FIG. 2 according to example embodiments.

Assuming, for the sake of explanation, that the ADC 10 of FIG. 2 includes two accumulators, FIG. 4 is a diagram of the waveforms of signals generated by a second-order sigma-delta ADC 10 of FIG. 2. Referring to FIGS. 2 and 3, the clock signal CLK input to the sigma-delta modulator 11 is a clock signal for driving the second-order sigma-delta ADC 10. When an input signal is input to the sigma-delta modulator 11, a digital signal having a value of "0" and a value of "1" according to the clock signal CLK is output. The first accumulator 1 receives and accumulates the digital output signal and outputs a first-order accumulation result. The second accumulator 2 receives and accumulates the first-order accumulation result and outputs a second-order accumulation result. In a similar manner, the N-th accumulator N, in an N-th-order sigma-delta ADC 10, receives and accumulates an (N−1)-th-order accumulation result and outputs an N-th order accumulation result.

In detail, referring to FIG. 4, the digital output signal has the value of "1" at 3rd, 6th, 12th, 13th, and 14th clocks of the clock signal CLK. At each of those clocks, the first accumulator 1 accumulates the digital output signal and outputs the first-order accumulation result. At each of the 3rd, 6th, 12th, 13th, and 14th clocks, the first-order accumulation result increases by 1. The second accumulator 2 accumulates the first-order accumulation result and outputs the second-order accumulation result. The second-order accumulation result increases by 1 at each of the 3rd to 5th clocks, increases by 2 at each of the 6th to 11th clocks, increases by 3 at the 12th clock, increases by 4 at the 13th clock, and increases by 5 at each of the 15th to 17th clocks.

Figure 5:
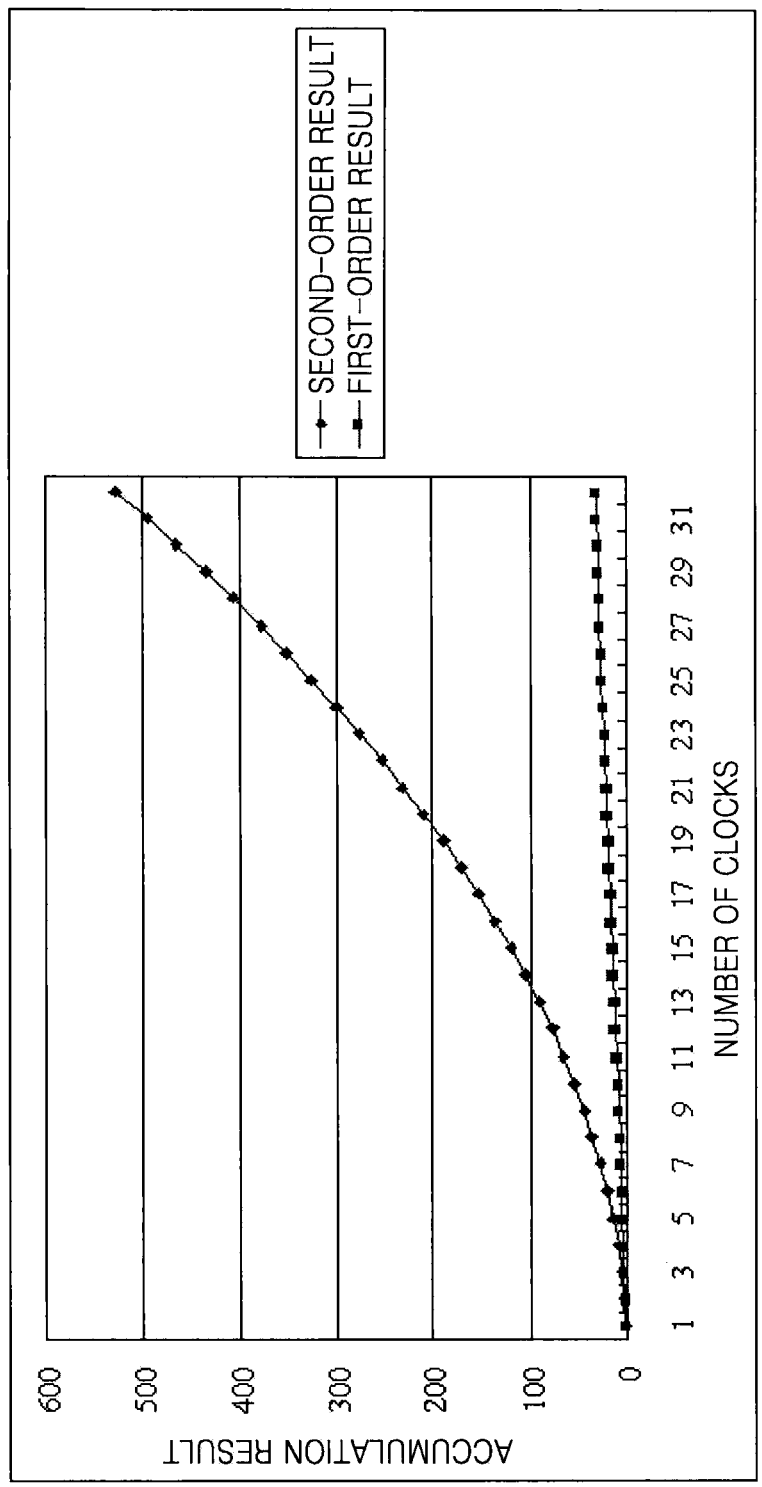
FIG. 5 is a graph of the number of input clock cycles versus an accumulation result in second order sigma-delta ADC of FIG. 2 according to example embodiments.

FIG. 5 is a graph of the number of input clocks versus an accumulation result in the second-order sigma-delta ADC 10 of FIG. 2. Referring to FIG. 5, when the number of input clocks increases, the accumulation result of the second-order sigma-delta ADC 10 also increases. In addition, when the order of the accumulation, i.e., the number of accumulations increases, the accumulation result increases. In detail, the second-order accumulation result obtained when the number of accumulators is 2 greatly increases as compared to the first-order accumulation result obtained when the number of accumulator is 1.

Figure 6:
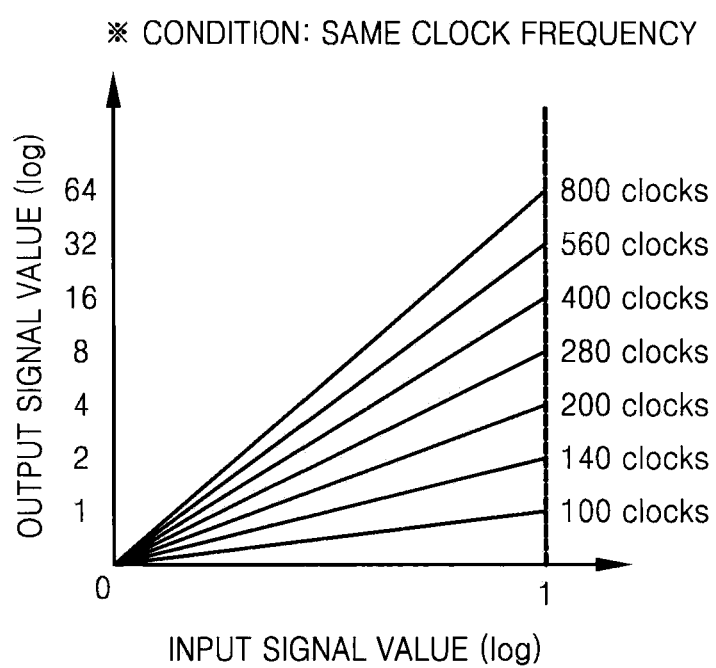
FIG. 6 is a graph illustrating the relationship between the input and the output of the second order sigma-delta ADC of FIG. 2 with respect to the number of clock cycles according to example embodiments.

FIG. 6 is a graph illustrating the relationship between the input and the output of the second-order sigma-delta ADC 10 of FIG. 2 with respect to the number of clocks. The graph shown in FIG. 6 illustrates the relationship between the number of clocks and the accumulation result illustrated in FIG. 5 and shows a standardized input signal value versus a standardized output signal value. The accumulation result show in FIG. 5 may be considered as the gain of the second-order sigma-delta ADC 10. Accordingly, when the number of clocks increases, the gain of the second-order sigma-delta ADC 10 also increases. Referring to FIG. 6, when the number of clocks increases "a" times, the gain increases "$a^2$" times. For instance, when the number of clocks is adjusted from 100 to 800, the number of clocks increases 8 times, and therefore, the gain increases 64 times. Consequently, the gain of the second-order sigma-delta ADC 10 can be changed by adjusting the number of clocks. Herein, a clock frequency is kept relatively constant.

Figure 7:
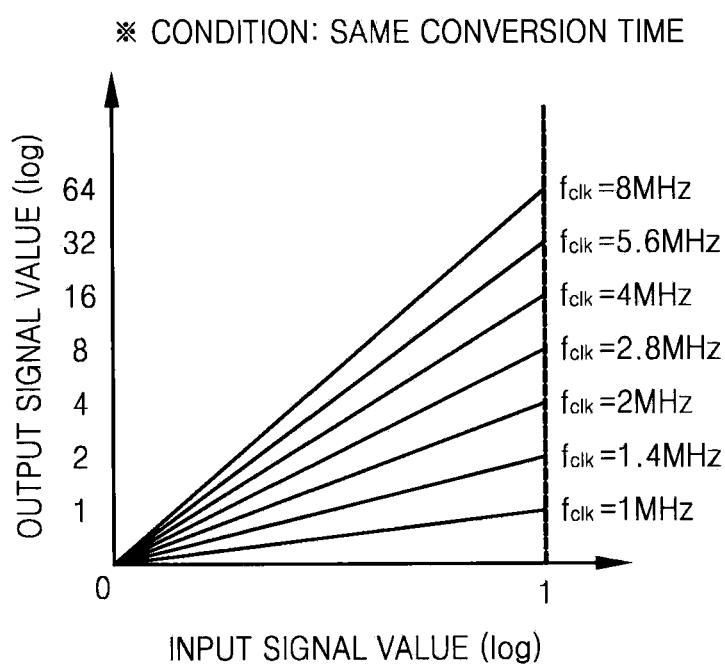
FIG. 7 is a graph illustrating the relationship between the input and the output of the second order sigma-delta ADC of FIG. 2 with respect to a clock frequency according to example embodiments.

FIG. 7 is a graph illustrating the relationship between the input and the output of the second-order sigma-delta ADC 10 of FIG. 2 with respect to a clock frequency. Like the graph of FIG. 6, the graph of FIG. 7 shows a standardized input signal value versus a standardized output signal value. Referring to FIG. 7, when the clock frequency increases, the number of clocks increases, and therefore, the gain of the second-order sigma-delta ADC 10 also increases. Herein, when the clock frequency increases "b" times, the gain increases "$b^2$" times. For instance, when the clock frequency is adjusted from 1 MHz to 8 MHz, it increases 8 times, and therefore, the gain increases 64 times. Consequently, the gain of the second-order sigma-delta ADC 10 can be changed by adjusting the clock frequency. Since the clock frequency is proportional to the number of clocks, when the clock frequency increases, the number of clocks also increases, and therefore, the gain of the second-order sigma-delta ADC 10 also increases as illustrated in FIG. 6. Herein, an analog-to-digital conversion time is not changed. The adjustment of the clock frequency may be performed by a frequency divider (not shown) which is disposed within the control circuit 30 illustrated in FIG. 1 and which changes a frequency division factor in response to an external adjustment signal, but example embodiments are not restricted thereto.

Figure 8:
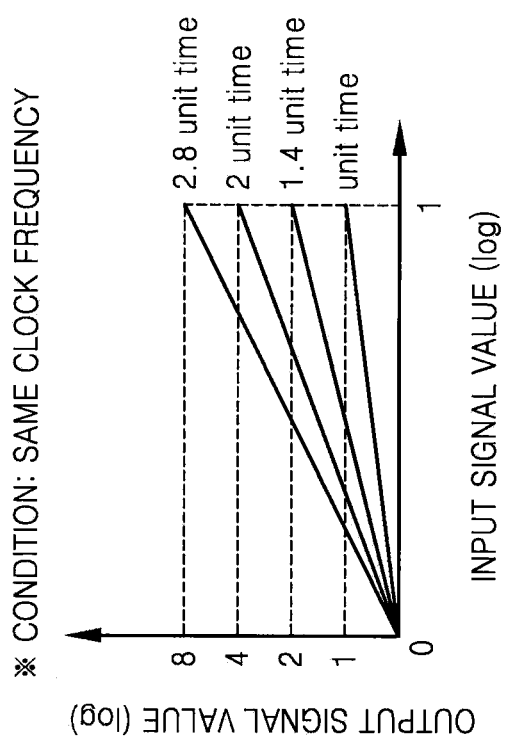
FIG. 8 is a graph illustrating the relationship between the input and the output of the second order sigma-delta ADC of FIG. 2 with respect to an analog-to-digital conversion time according to example embodiments.

FIG. 8 is a graph illustrating the relationship between the input and the output of the second-order sigma-delta ADC 10 of FIG. 2 with respect to an analog-to-digital conversion time. Like the graph of FIG. 6, the graph of FIG. 8 shows a standardized input signal value versus a standardized output signal value. Referring to FIG. 8, when the analog-to-digital conversion time increases, the number of clocks increases, and therefore, the gain of the second-order sigma-delta ADC 10 also increases. Herein, when the analog-to-digital conversion time increases "c" times, the gain increases "$c^2$" times. For instance, when the analog-to-digital conversion time is adjusted from 1 unit time to 2 unit time, the analog-to-digital conversion time increases 2 times, and therefore, the gain increases 4 times. Consequently, the gain of the second-order sigma-delta ADC 10 can be changed by adjusting the analog-to-digital conversion time. Since the analog-to-digital conversion time is proportional to the number of clocks, when the analog-to-digital conversion time increases, the number of clocks also increases, and therefore, the gain of the second-order sigma-delta ADC 10 increases as illustrated in FIG. 6. Herein, the clock frequency is not changed.

The analog-to-digital conversion time may be determined by a setting value of the control circuit 30 illustrated in FIG. 1. When the setting value of the control circuit 30 is adjusted, the period of the second-order sigma-delta ADC 10 is changed, and therefore, the analog-to-digital conversion time is adjusted. However, example embodiments are not restricted to the above examples.

Figure 9:
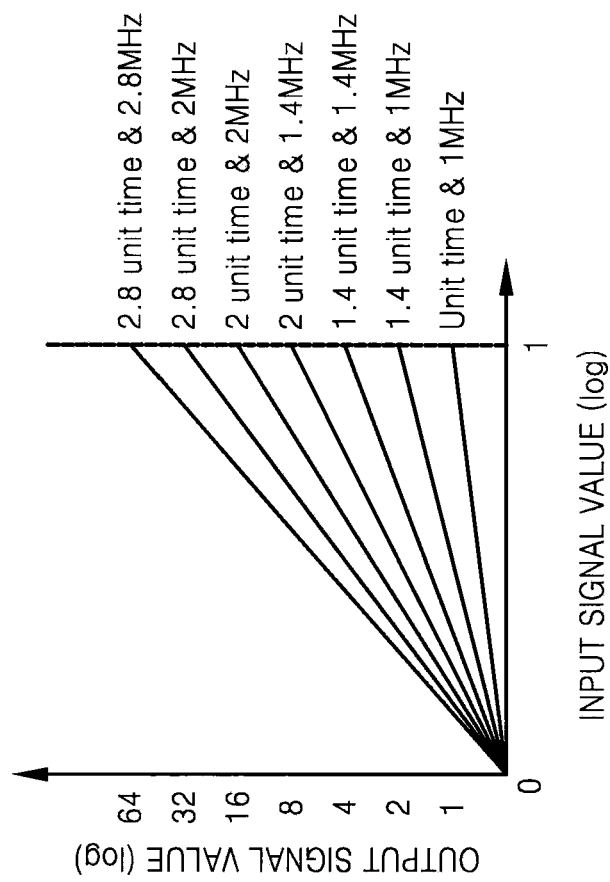
FIG. 9 is a graph illustrating the relationship between the input and the output of the second order sigma-delta ADC of FIG. 2 with respect to an analog-to-digital conversion time and a clock frequency according to example embodiments.

FIG. 9 is a graph illustrating the relationship between the input and the output of the second-order sigma-delta ADC 10 of FIG. 2 with respect to an analog-to-digital conversion time and a clock frequency. Like the graph of FIG. 6, the graph of FIG. 9 shows a standardized input signal value versus a standardized output signal value. Referring to FIG. 9, when the analog-to-digital conversion time and the clock frequency increase, the number of clocks also increases, and therefore, the gain of the second-order sigma-delta ADC 10 increases. Herein, when the analog-to-digital conversion time increases "c" times and the clock frequency increases "b" times, the gain increases "$c^2b^2$" times. For instance, when the analog-to-digital conversion time is adjusted from 1 unit time to 2 unit time and the clock frequency is adjusted from 1 MHz to 2 MHz, the analog-to-digital conversion time increases 2 times and the clock frequency increases 2 times, and therefore, the gain increases 16 times. Consequently, the gain of the second-order sigma-delta ADC 10 can be changed by adjusting the analog-to-digital conversion time and the clock frequency. Since the analog-to-digital conversion time and the clock frequency are proportional to the number of clocks, when the analog-to-digital conversion time and the clock frequency increase, the number of clocks also increases. As a result, the gain of the second-order sigma-delta ADC 10 increases as illustrated in FIG. 6.

Figure 10:
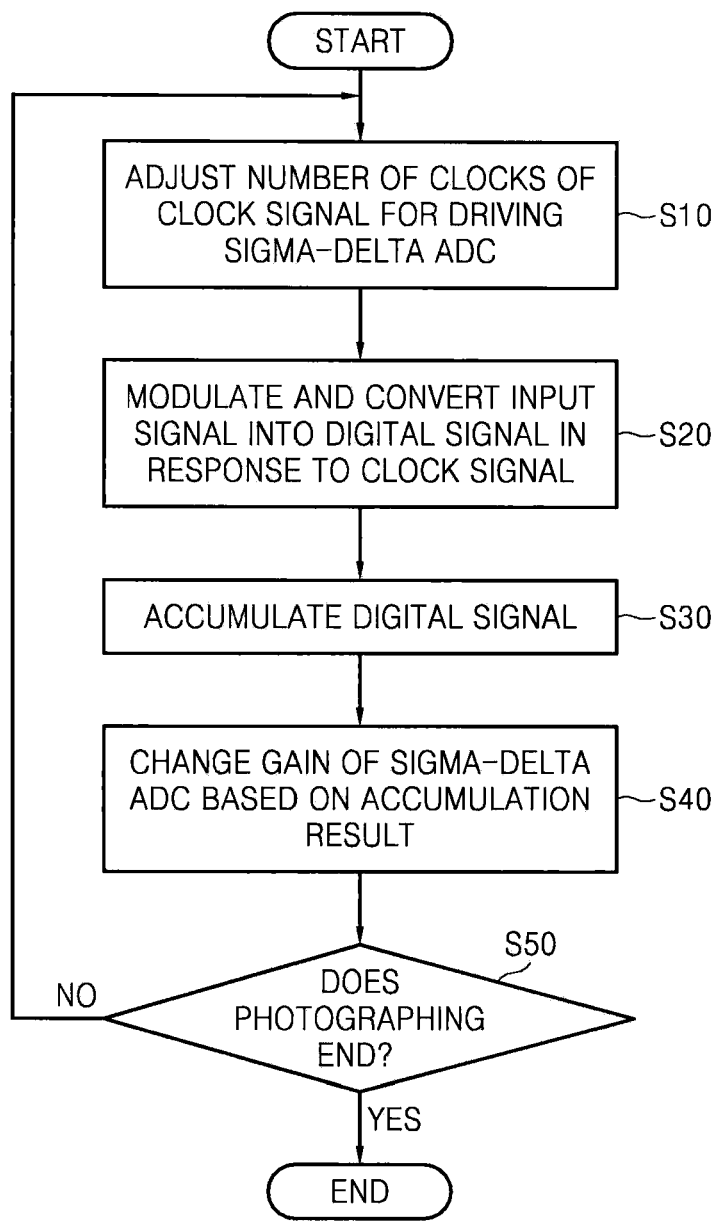
FIG. 10 is a flowchart of a procedure for changing a gain of a sigma-delta ADC according to example embodiments.

FIG. 10 is a flowchart of a procedure for changing a gain of a sigma-delta ADC according to example embodiments. The procedure may be performed by the sigma-delta ADC 10 shown in FIG. 2. Referring to FIG. 10, the number of clocks of a clock signal for driving the sigma-delta ADC 10 is adjusted in operation S10. The number of clocks may be adjusted by adjusting an analog-to-digital conversion time and/or a clock frequency.

Thereafter, an input signal is modulated and converted into a digital signal in response to the adjusted clock signal in operation S20. Thereafter, the digital signal is accumulated in operation S30. For example, the accumulation may include integrating digital values of the digital signal. Next, the gain of the sigma-delta ADC 10 is changed based on an accumulation result in operation S40. Thereafter, it is determined whether photographing ends in operation S50. If the photographing does not end, the above-described operations are repeated.

Figure 11:
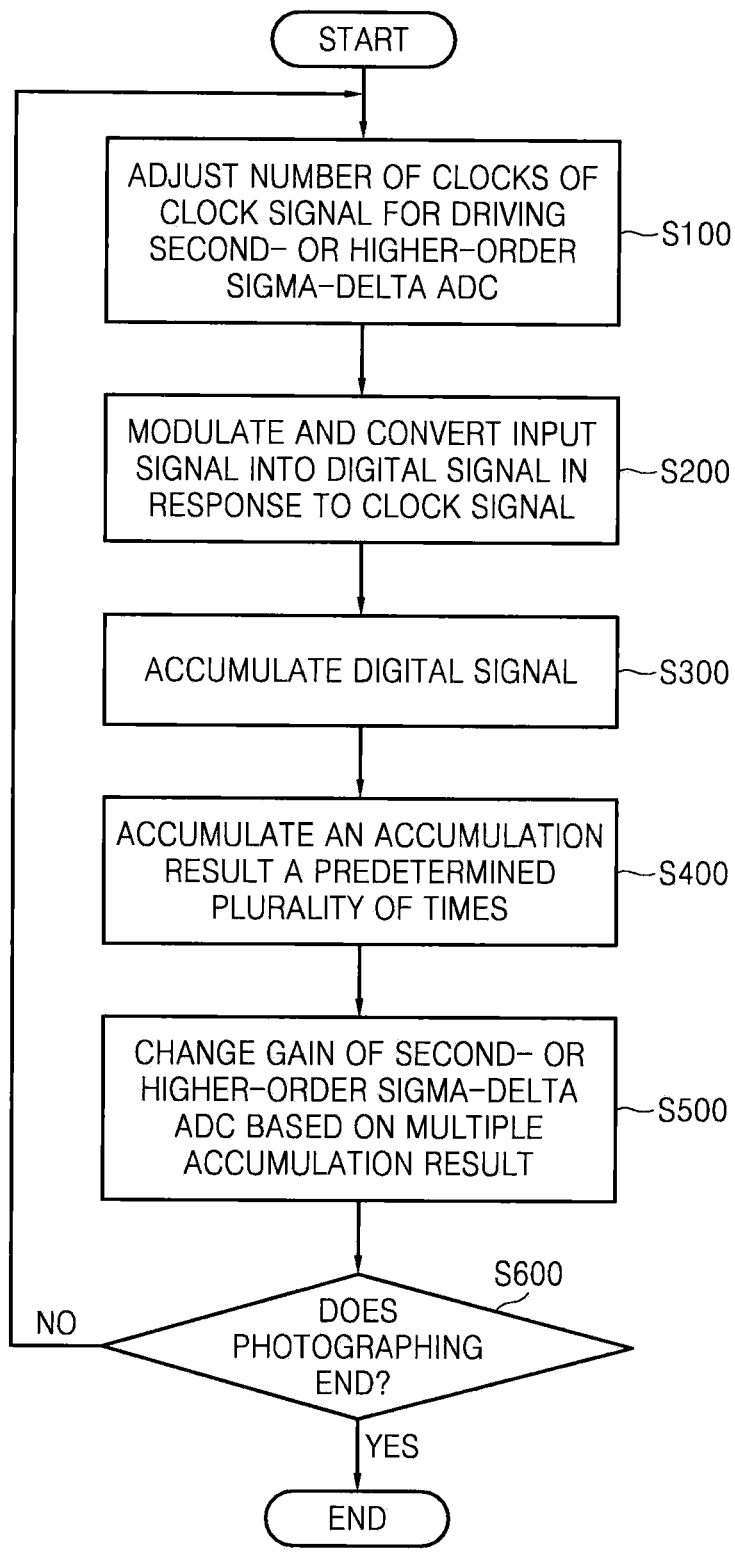
FIG. 11 is a flowchart of a procedure for changing a gain of a second- or higher-order sigma-delta ADC according to example embodiments.

FIG. 11 is a flowchart of a procedure for changing a gain of a second or higher-order sigma-delta ADC according to example embodiments. The procedure may be performed by the sigma-delta ADC 10 including the accumulation unit 13 illustrated in FIG. 3. Referring to FIG. 11, the number of clocks of a clock signal for driving the second or higher-order sigma-delta ADC 10 is adjusted in operation S100. The number of clocks may be adjusted by adjusting an analog-to-digital conversion time and/or a clock frequency.

Thereafter, an input signal is modulated and converted into a digital signal in response to the adjusted clock signal in operation S200. Thereafter, the digital signal is accumulated in operation S300. For example, the accumulation may include integrating digital values of the digital signal. Next, the accumulation result is accumulated a desired/predetermined plurality of times in operation S400. For example, the multiple accumulations may include integrating the accumulation result. The desired/predetermined plurality of times are related with the number of the accumulators 1 through N included in the accumulation unit 13.

Next, the gain of the second or higher-order sigma-delta ADC 10 is changed based on a multiple accumulation result in operation S500. Thereafter, it is determined whether photographing ends in operation 5600. If the photographing does not end, the above-described operations are repeated.

Figure 12:
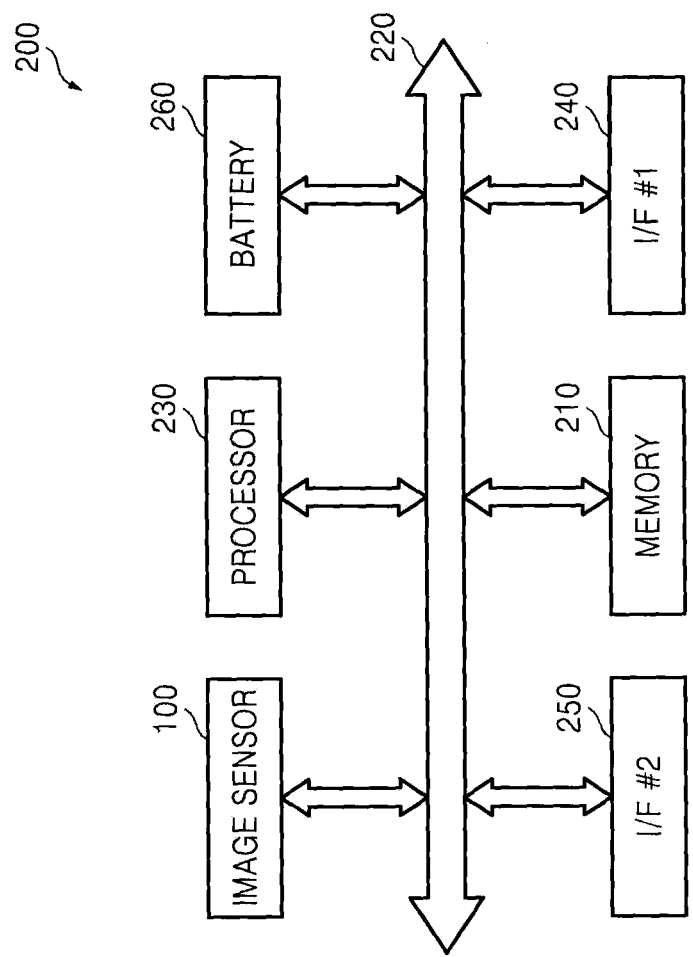
FIG. 12 is a block diagram of an electronic system including an image sensor according to example embodiments.

FIG. 12 is a block diagram of an electronic system 200 including the image sensor 100 according to example embodiments. Referring to FIG. 12, the electronic system 200 may include the image sensor 100, a memory 210, and a processor 230, which are connected to a system bus 220.

The electronic system 200 may be a digital camera, a mobile phone equipped with a digital camera, or a satellite system equipped with a camera, but example embodiments are not restricted thereto.

The processor 230 may generate control signals for controlling the operations of the image sensor 100 and the memory 210. The image sensor 100 generates an image corresponding to a photographed subject and the memory 210 stores the image.

When the electronic system 200 is embodied as a portable application/system, the electronic system 200 may also include a battery 260 to supply operating power to the image sensor 100, the memory 210, and the processor 230.

The electronic system 200 may also include an interface 240, e.g., an input/output unit, to communicate data with an external data processing device. When the electronic system 200 is a wireless system, the electronic system 200 may also include a wireless interface 250. The wireless system may be a wireless device such as a PDA, a portable computer, a wireless telephone, a digital camera, a MP3 player, a portable multimedia player, an automotive navigation system, a memory card, or an electronic dictionary.

As described above, according to example embodiments, an ADC changes its gain by changing a system parameter, for example, the number of clocks (i.e., the number of cycles of a clock signal) during the analog-to-digital conversion time without requiring an additional device. The change/variation in the number of clocks may be achieved by changing the analog-to-digital conversion time and/or the frequency of the clock signal. In addition, the sensitivity of an image sensor is adjusted using the ADC.

However, example embodiments may be limited thereto. For example, it will be obvious to one of ordinary skills in the art that any system parameter that results in an increase in the gain of the ADC may be varied. Also, the change/variation in the number of clocks may be achieved by adjusting some other parameter(s) and/or by other method(s), each of which are obvious to one of ordinary skill in the art.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An analog-to-digital converter comprising:
a sigma-delta modulator configured to sigma-delta modulate an input signal into a digital output signal in response to a clock signal; and
an accumulator configured to accumulate the digital output signal at each cycle of the clock signal according to an analog-to-digital conversion time and output an accumulation result, wherein
the accumulation result changes based on a change in at least a first parameter, the first parameter corresponding to a period of operation of the accumulator, the period of operation of the accumulator being the analog-to-digital conversion time, and
the accumulation result changes based on a change in a number of clocks of the clock signal during the analog-to-digital conversion time, and a clock frequency of the clock signal is fixed and the analog-to-digital conversion time is varied to vary the number of clocks of the clock signals during the analog-to-digital conversion time.

2. The analog-to-digital converter of claim 1, wherein the accumulation result changes based on a change in a second parameter corresponding to a number of clocks of the clock signal.

3. The analog-to-digital converter of claim 1, wherein the accumulator receives the digital output signal, accumulates the digital output signal N times, and outputs a result of the N accumulations as the accumulation result, wherein N is a natural number equal to or greater than 2.

4. An analog-to-digital converter, comprising:
a sigma-delta modulator configured to sigma-delta modulate an input signal into a digital output signal in response to a clock signal; and
an accumulator configured to accumulate the digital output signal at each cycle of the clock signal according to an analog-to-digital conversion time and output an accumulation result, wherein the accumulation result changes based on a change in at least one parameter and wherein the accumulator comprises
first through N-th accumulators connected in series,
the first accumulator accumulating the digital output signal at each cycle of the clock signal, and
the second through N-th accumulators accumulating an output of a previous accumulator at each cycle of the clock signal, wherein N≥2.

5. The analog-to-digital converter of claim 2, wherein the accumulation result changes based on a change in a second parameter corresponding to a clock frequency of the clock signal, variation of the clock frequency varying a number of clocks of the clock signals during the analog-to-digital conversion time.

6. The analog-to-digital converter of claim 1, wherein the accumulation result changes based on a change in a clock frequency of the clock signal and a change in the analog-to-digital conversion time, the changes varying a number of clocks of the clock signals during the analog-to-digital conversion time.

7. The analog-to-digital converter of claim 1, wherein changing the analog-to-digital conversion time causes the accumulation result to increase and a gain of the analog-to-digital converter to increase.

8. An image sensor comprising the analog-to-digital converter of claim 1.

9. An electronic system comprising the image sensor of claim 8.

10. An image sensor comprising:
a pixel array including a plurality of pixels;
the analog-to-digital converter including,
a sigma-delta modulator configured to sigma-delta modulate an input signal into a digital output signal in response to a clock signal, and
an accumulator configured to accumulate the digital output signal at each cycle of the clock signal according to an analog-to-digital conversion time and output an accumulation result, wherein the accumulation result changes based on a change in at least a first parameter, the first parameter corresponding to a period of operation of the accumulator;
the analog-to-digital converter configured to receive a signal output from the pixel array and the clock signal, and to convert the input signal into a digital signal in an analog-to-digital conversion time; and
a control circuit configured to vary the first parameter during the analog-to-digital conversion time and provide the changed first parameter to the analog-to-digital converter.

11. The image sensor of claim 10, wherein the control circuit is configured to vary a second parameter corresponding to a number of clocks of the clock signal.

12. The image sensor of claim 10, wherein the accumulator receives the digital output signal, accumulates the digital output signal N times, and outputs a result of the N accumulations as the accumulation result, wherein N is a natural number equal to or greater than 2.

13. The image sensor of claim 12, wherein the accumulator comprises first through N-th accumulators connected in series, the first accumulator accumulating the digital output signal at each cycle of the clock signal, and the second through N-th accumulators accumulating an output of a previous accumulator at each cycle of the clock signal, where N ≥2.

14. The image sensor of claim 10, wherein the control circuit changes a second parameter corresponding to a clock frequency of the clock signal, changing the clock frequency varying a number of clocks of the clock signals during the analog-to-digital conversion time.

15. The image sensor of claim 10, wherein the control circuit controls a clock frequency of the clock signal to be fixed and the control circuit changes the analog-to-digital conversion time to vary the number of clocks of the clock signals during the analog-to-digital conversion time.

16. The image sensor of claim 10, wherein the control circuit changes a clock frequency of the clock signal and the duration of the analog-to-digital conversion time to vary the number of clocks of the clock signals during the analog-to-digital conversion time.

17. A method of operating an analog-to-digital converter, the method comprising:
sigma-delta modulating an input signal into a digital output signal in response to a clock signal input to the analog-to-digital converter;
changing at least a first parameter;
accumulating the digital output signal at each cycle of the input clock signal according to the changed first parameter, the first parameter corresponding to an analog-to-digital conversion time; and
outputting an accumulation result, the accumulation result changes based on a change in a number of clocks of the clock signal during the analog-to-digital conversion time, and a clock frequency of the clock signal is fixed and the analog-to-digital conversion time is varied to vary the number of clocks of the clock signals during the analog-to-digital conversion time.

18. The analog-to-digital converter of claim 4, wherein the accumulation result changes based on a change in a clock frequency of the clock signal.

* * * * *